(12) United States Patent
Koguchi

(10) Patent No.: US 6,821,073 B1
(45) Date of Patent: Nov. 23, 2004

(54) CONTAINER HANDLING SYSTEM FOR SUBSTRATE PROCESSING APPARATUS AND METHOD OF HANDLING CONTAINERS

(75) Inventor: Akira Koguchi, Maebaru (JP)

(73) Assignee: Tokyo Electron Limited, Tokyo (JP)

( * ) Notice: Subject to any disclaimer, the term of this patent is extended or adjusted under 35 U.S.C. 154(b) by 1 day.

(21) Appl. No.: 09/611,635

(22) Filed: Jul. 7, 2000

(30) Foreign Application Priority Data

Jul. 9, 1999 (JP) .......................................... 11-196688

(51) Int. Cl.⁷ ............................................ B65G 65/34
(52) U.S. Cl. ...................................... 414/403; 414/940
(58) Field of Search ................................ 414/938, 939, 414/940, 936, 403, 217

(56) References Cited

U.S. PATENT DOCUMENTS

| | | | |
|---|---|---|---|
| 4,923,353 A | * 5/1990 | Tullis et al. ............. | 414/222.06 |
| 5,303,810 A | * 4/1994 | Tani ........................ | 198/345.3 |
| 5,468,111 A | * 11/1995 | Flint et al. ................ | 118/500 |
| 5,527,390 A | * 6/1996 | Ono et al. ................ | 118/719 |
| 5,586,585 A | * 12/1996 | Bonora et al. ............ | 141/93 |
| 5,740,053 A | 4/1998 | Iwama | |
| 5,931,631 A | * 8/1999 | Bonora et al. .......... | 414/416.01 |
| 5,942,012 A | * 8/1999 | Kumasaka et al. ........ | 29/25.01 |
| 5,980,183 A | * 11/1999 | Fosnight ................. | 414/222.01 |
| 6,004,047 A | * 12/1999 | Akimoto et al. .......... | 118/52 |
| 6,026,561 A | * 2/2000 | Lafond ....................... | 29/722 |
| 6,082,949 A | * 7/2000 | Rosenquist .............. | 414/217 |
| 6,097,492 A | * 8/2000 | Kondo et al. ............... | 250/548 |
| 6,135,698 A | * 10/2000 | Bonora et al. .......... | 414/416.01 |
| 6,138,694 A | * 10/2000 | Hansen et al. ............ | 134/58 R |
| 6,169,935 B1 | * 1/2001 | Iwasaki et al. ............. | 414/273 |
| 6,447,232 B1 | * 9/2002 | Davis et al. .............. | 414/217.1 |
| 6,477,440 B1 | * 11/2002 | Davis ........................ | 700/123 |

* cited by examiner

*Primary Examiner*—Donald P. Walsh
*Assistant Examiner*—Jeffrey A. Shapiro
(74) *Attorney, Agent, or Firm*—Morrison & Foerster LLP

(57) ABSTRACT

A carrier is carried between a receiving stage (21) (or a delivery stage (22)) by a movable table (24). Each of the stages is provided with a cut-away area (30) extending from one end of the stage to a predetermined position at which the carrier is placed on the stage and allowing the movable table (24) to move vertically therethrough. The movable table (24) is moved under the stage to a position directly below the carrier mounted on the stage, is raised through the cut-away area (30) to lift up the carrier, and is moved away from the stage together with the carrier. A sensing device (10) incorporated into the movable table (24) inspects the condition of wafers contained in the carrier while the movable table (24) is being moved to the position directly below the carrier placed on the stage.

16 Claims, 18 Drawing Sheets

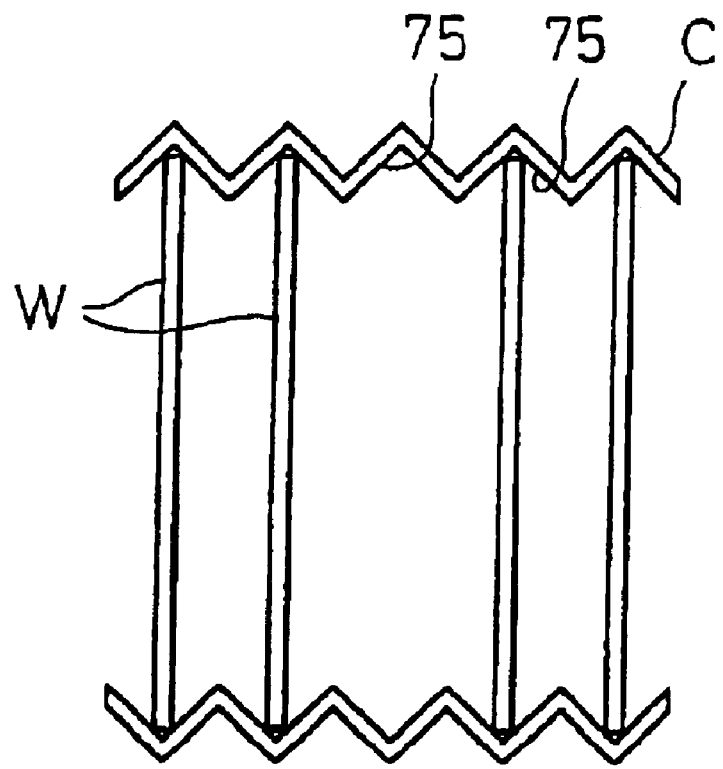
F I G. 14A
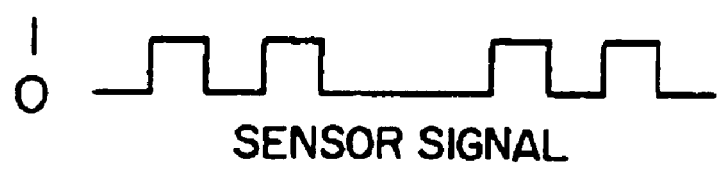
F I G. 14B

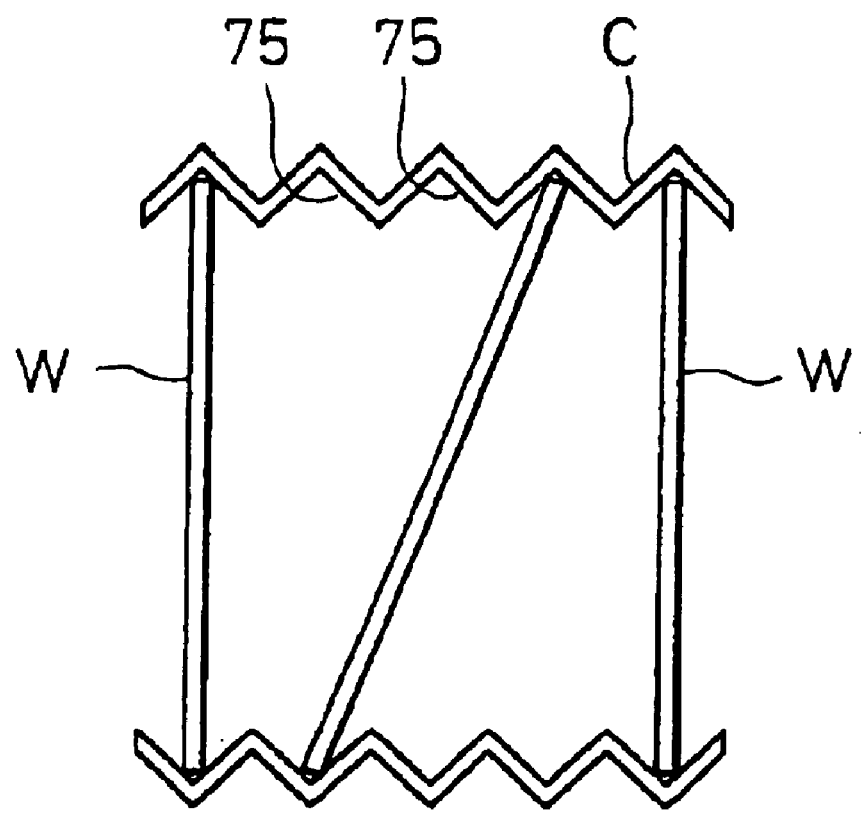
F I G. 15 A
F I G. 15 B

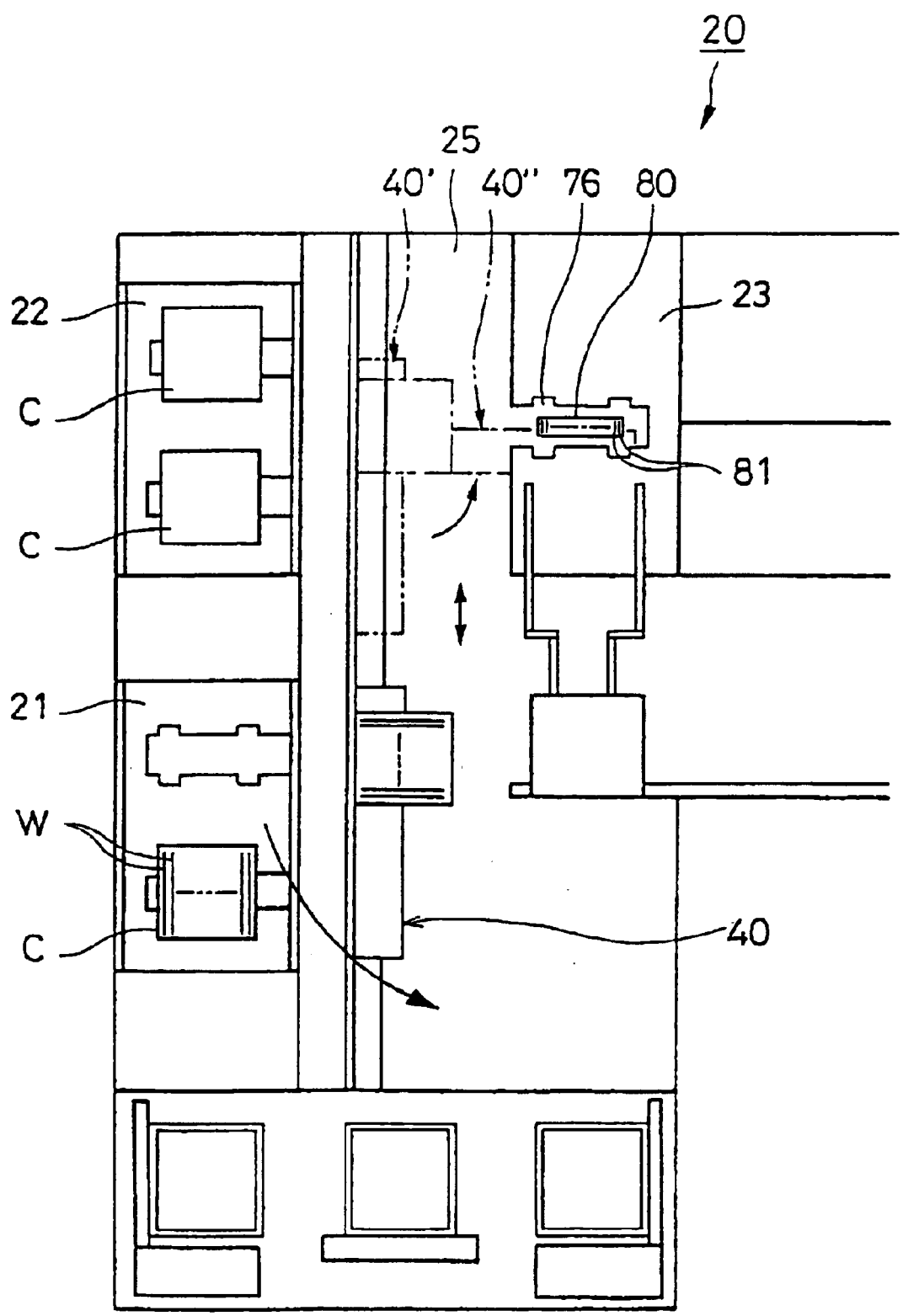
F I G. 16

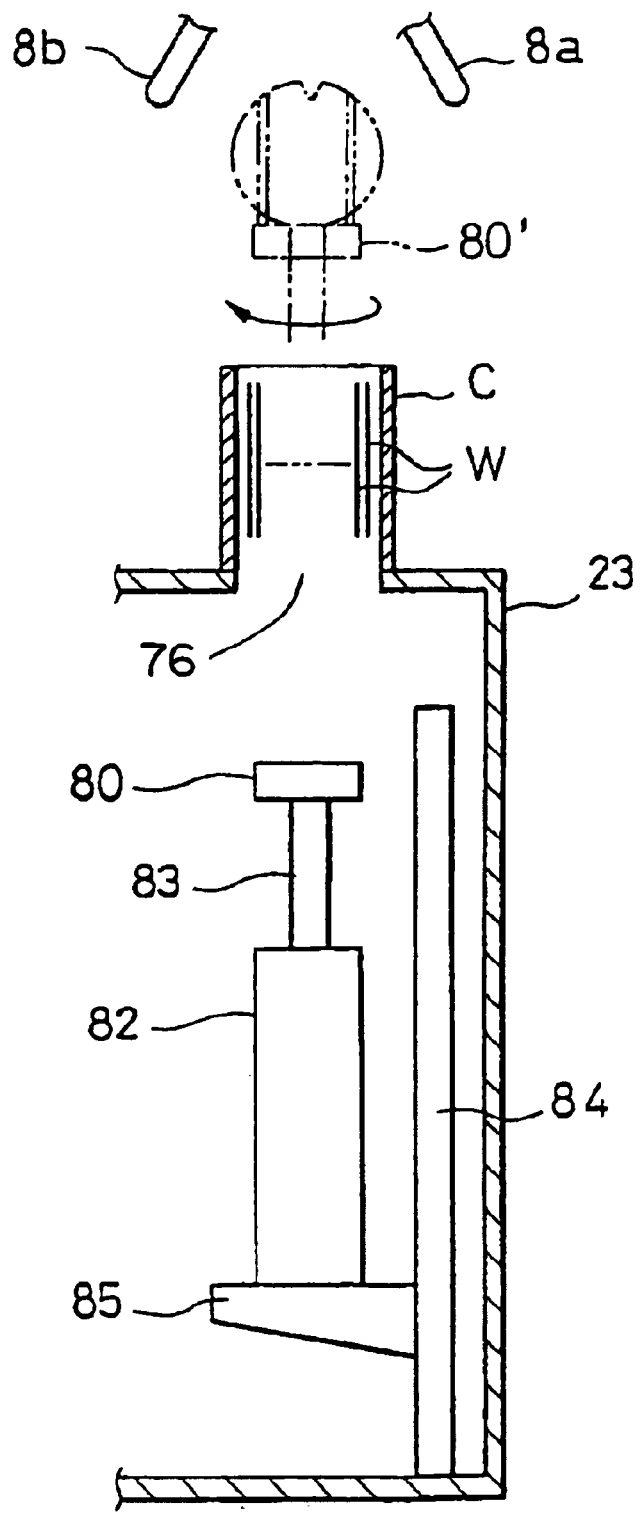
F I G. 17

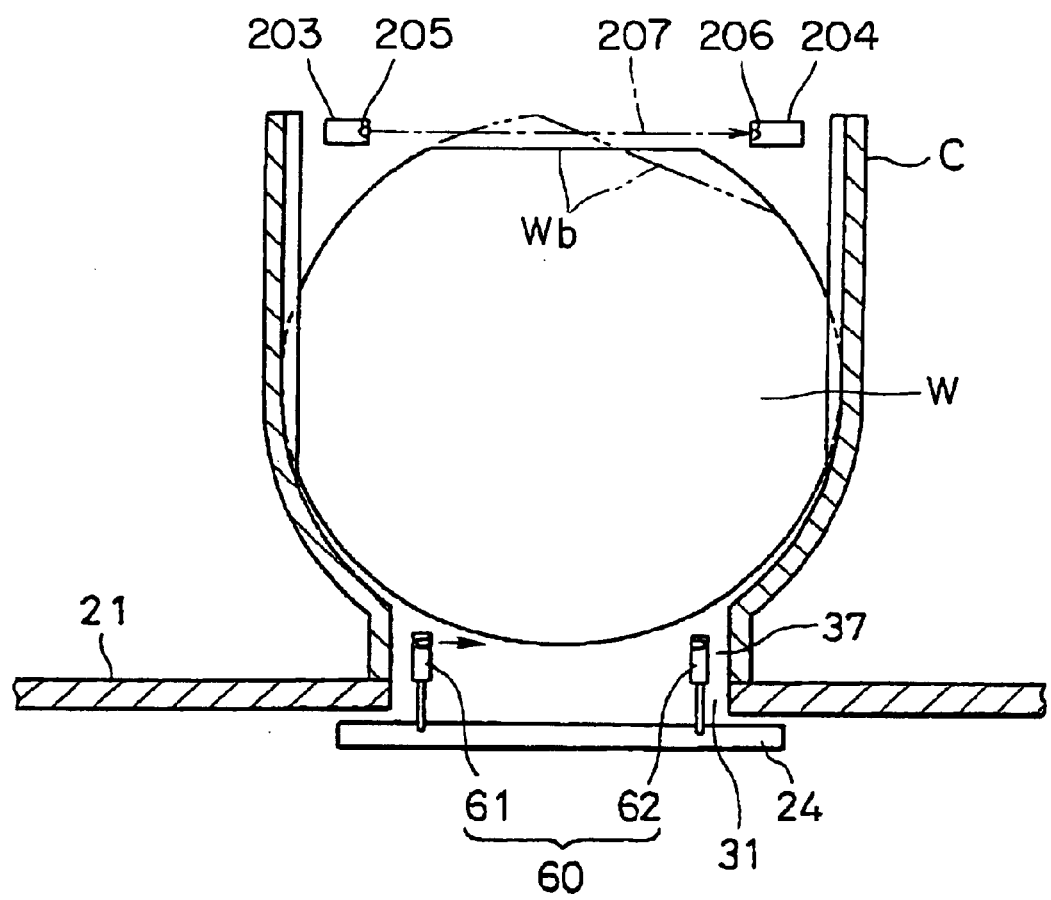
F I G. 21

CONTAINER HANDLING SYSTEM FOR SUBSTRATE PROCESSING APPARATUS AND METHOD OF HANDLING CONTAINERS

BACKGROUND OF THE INVENTION

1. Field of the Invention

The present invention relates to an apparatus for processing substrates, such as semiconductor wafers, and more specifically, to improvements in a container handling system for handing containers, such as carriers, provided in a substrate processing apparatus.

2. Description of the Related Art

A semiconductor device fabricating process uses a cleaning apparatus for cleaning semiconductor wafers, i.e., substrates, with a cleaning liquid, such as a predetermined chemical liquid or pure water, to remove contaminants, such as particles, organic contaminants and metal impurities, adhering to the surfaces of the wafers. Wet cleaning apparatus that cleans wafers by immersing the wafers in a cleaning tank containing a cleaning liquid are used prevalently.

In the known cleaning apparatus, an operator or an unmanned vehicle, such as an automatic guided vehicle (AGV), caries a plurality of carriers, i.e., containers, usually two containers, each containing twenty-five uncleaned wafers to a carrier receiving unit and places the carriers on a receiving stage installed in the carrier receiving unit. The carriers are carried by a lifter, i.e., moving means, to an unloading stage installed in the carrier receiving unit. Then, the fifty wafers are taken out of the two carriers on the unloading stage. The fifty wafers are carried to a wafer cleaning and drying unit and are subjected to a cleaning and drying process of a batch processing system. The wafers thus processed are carried to a carrier delivery unit. The wafers are loaded into empty carriers prepared on a loading stage installed in the carrier delivery unit. Then, the loaded carriers are moved to a delivery stage installed in the carrier delivery unit and are carried out of the cleaning apparatus by an operator.

A wafer counter is disposed above the unloading stage. The wafer counter counts the number of the wafers contained in each carrier and inspects the carrier for jump-slots before the wafers are taken out of the carrier. A wafer counter is disposed above the loading stage to count the wafers after the wafers have been loaded into the carriers so that any wafers may not be left in the cleaning and drying unit.

In the conventional carrier receiving unit and carrier delivery unit, the lifters and lifter driving mechanisms are disposed in spaces above the receiving stage and the delivery stage, respectively. Therefore, it is possible that the operator touches the lifter or the driving mechanism accidentally when carrying the carriers onto the receiving stage or taking out the carriers from the delivery stage and the operator is injured. Moreover, the carrier receiving unit and the carrier delivery unit are congested with the lifters and the driving mechanism and have a complicated configuration. Since the wafer counters are disposed above the unloading stage and the loading stage, respectively, it is possible that accidents occur during inspection, and the carrier receiving unit and the carrier delivery unit are further congested with the wafer counters.

SUMMARY OF THE INVENTION

Accordingly, it is a first object of the present invention to provide a container handling system in which carrier moving means are not disposed in spaces above stages on which carriers are placed.

A second object of the present invention is to provide a container handling system having inspecting means not disposed in spaces above stages and capable of efficiently inspecting the storage condition of substrates contained in containers.

A third object of the present invention is to improve container handling efficiency.

A first aspect of the present invention is a substrate processing apparatus comprising: a plurality of stages, on each of which a container for containing substrates therein is to be placed; and a first section at which the substrates are taken out from the container and/or are put into the container, wherein a first stage amongst the stages is provided at the first section; and a movable table carrying the container between the first stage and one of the stages other than the first stage, while the container being placed thereon.

A second aspect of the present invention is a method of carrying a container for containing substrates between two stages included in a substrate processing apparatus, said method comprising the steps of: (a) moving a movable table for transporting a container to a position below a surface of a first stage on which a container is placed thereon; (b) raising the movable table through a cut-away area formed in the first stage to a position above the surface of the first stage, thereby lifting up the container from the first stage by the movable table; (c) withdrawing the movable table, on which the container is placed, from a position above the first stage; (d) moving the movable table to a position above a second stage; and (e) lowering the movable table through a cut-away area formed in the second stage to a position below a surface of the second stage, thereby placing the container on the second stage.

A third aspect of the present invention is a method of handling containers for containing substrates, said method comprising the steps of: (a) delivering a plurality of containers containing substrates onto a receiving stage; (b) transferring one of the plurality of containers to an unloading stage; (c) taking out substrates from the container transferred to the unloading stage; and (d) repeating the steps (b) and (c).

A fourth aspect of the present invention is a method of handling containers for containing substrates, said method comprising the steps of: (a) putting substrates into a container on a loading stage; (b) transferring the container containing the substrates to a delivery stage after the completion of the step (a) before putting substrates into another container; (c) repeating the steps (a) and (b), thereby collecting a plurality of containers containing substrates on the delivery stage; and (d) delivering the plurality of containers collected on the delivery stage after the completion of the step (c).

A fifth aspect of the present invention is a method of handling containers for containing substrates, said method comprising the steps of: (a) delivering a plurality of containers each containing substrates onto a receiving stage; (b) transferring one of the plurality of containers to a loading/unloading stage; (c) taking out the substrates from the container transferred to the loading/unloading stage; (d) putting the substrates taken out of the container in the step (c) into the container from which the substrates were taken out in the step (c) on the loading/unloading stage; (e) transferring the container loaded with the substrates in the step (d) to a delivery stage; (f) repeating the steps (b) to (e), thereby collecting a plurality of containers loaded with substrates on the delivery stage; and (g) delivering the plurality of containers collected on the delivery stage after the completion of the step (f).

BRIEF DESCRIPTION OF THE DRAWING

FIG. 14A is a view of a carrier containing a number of wafers less than a predetermined number of wafers;

FIG. 14B is a waveform of a signal provided by a wafer counter when a carrier contains a number of wafers less than a predetermined number of wafers as shown in FIG. 14A;

FIG. 15A is a view of a carrier having a jump-slot therein;

FIG. 15B is a waveform of a signal provided by a wafer counter when a carrier has a jump-slot as shown in FIG. 15A;

FIG. 16 is an enlarged plan view of an essential portion of the cleaning apparatus shown in FIG. 1 of assistance in explaining an operation for moving a carrier toward a loading/unloading stage;

FIG. 17 is a schematic sectional view of the loading/unloading stage and a wafer hand disposed below the loading/unloading stage;

FIG. 21 is a schematic sectional view of a carrier of assistance in explaining an inspecting operation of an orientation flat sensor attached to the movable table of FIG. 19.

DESCRIPTION OF THE PREFERRED EMBODIMENTS

A cleaning apparatus capable of carrying out a series of operations for receiving, cleaning, drying and delivering semiconductor wafers will be described as an example of a substrate processing apparatus provided with a container handling system in a preferred embodiment according to the present invention.

Figure 1:
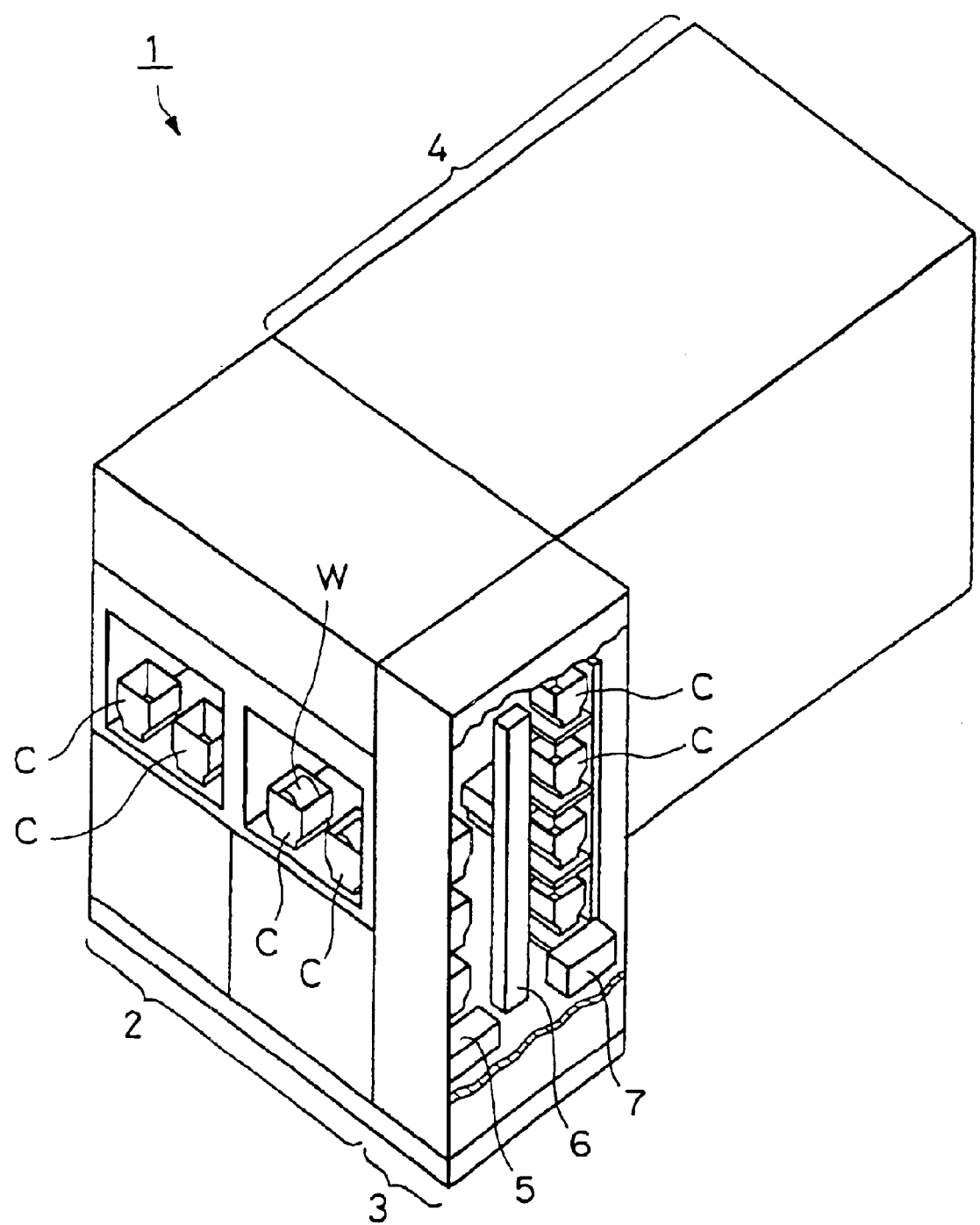
FIG. 1 is a partly cutaway perspective view of a cleaning apparatus, i.e., a substrate processing apparatus, in a preferred embodiment according to the present invention.
Figure 2:
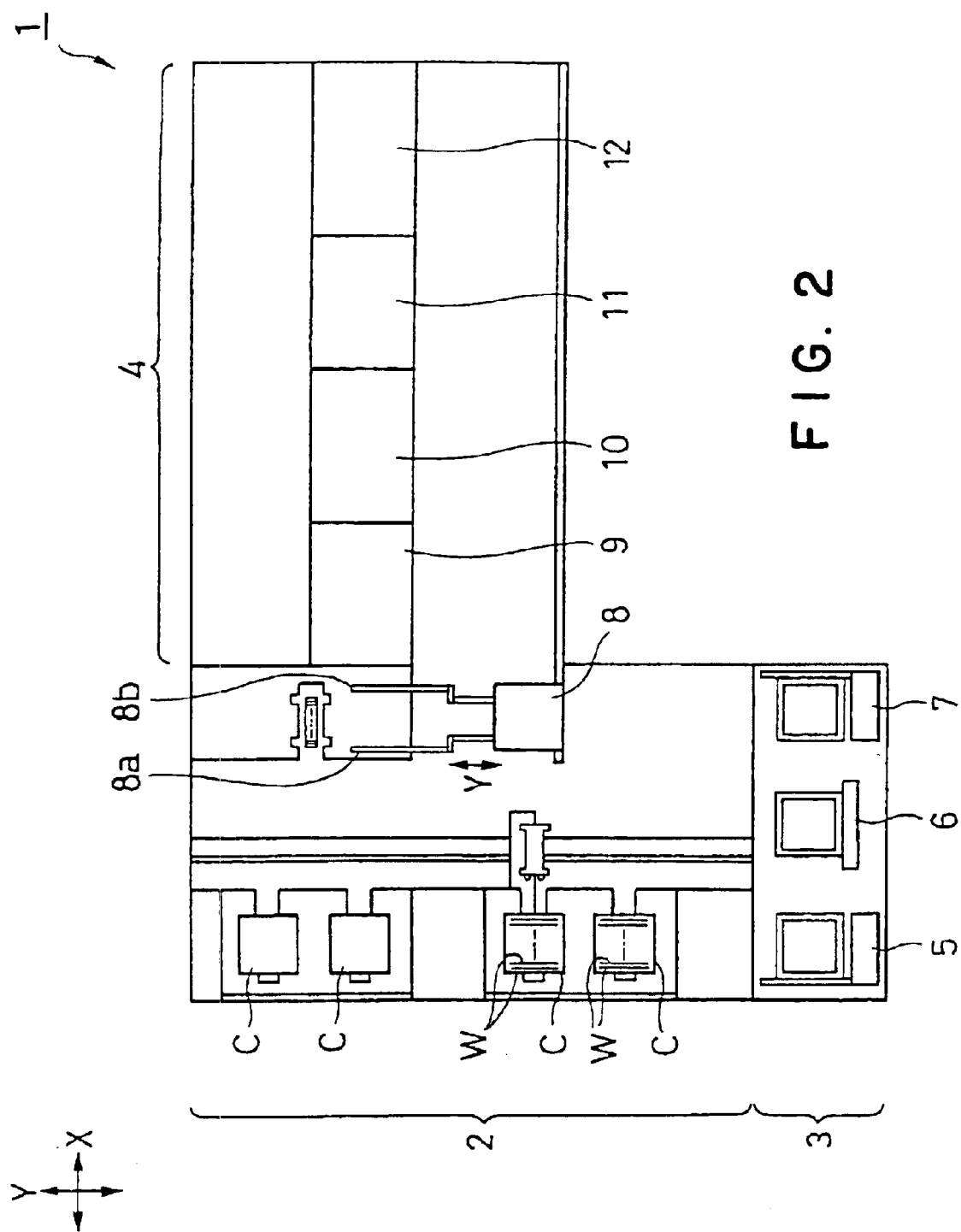
FIG. 2 is a plan view of the cleaning apparatus shown in FIG. 1.

Referring to FIGS. 1 and 2, a cleaning apparatus 1 has a carrier receiving/delivering department 2, a carrier storage department 3 for storing carriers C and a processing department 4 for cleaning and drying wafers W.

The receiving/delivering department 2 has a receiving section 2A, a delivery section 2B and a loading/unloading section 2C. The receiving section 2A receives wafers W to be cleaned by the cleaning apparatus 1 from an external of this cleaning apparatus. The delivery section 2B delivers wafers W processed by the processing department 4 from the cleaning apparatus 1. In the loading/unloading section 2C, wafers W to be subjected to cleaning and drying are taken out from carriers C, and cleaned and dried wafers W are put in carriers C.

In the carrier storage department 3, a storage device 5 for storing carriers C in a vertical direction, a lifting mechanism 6 for lifting carriers C, and a storage device 7 are aligned. The lifting mechanism 6 is capable of receiving and lifting carriers C transferred by a movable table 23 (described in detail hereinafter) and then of putting carriers C on empty shelves of the storage devices 5, 7. The lifting mechanism 6 is also capable of taking carriers C out of the shelves and carrying carriers C to the moving table 23.

The storage devices 5, 7 may have lifting means for lifting carriers C so that the carriers can be transferred between the storage devices 5, 7 and the lifting mechanism 6.

The processing department 4 has a drying device 9, a cleaning and rinsing device 10, a wafer holder cleaning and drying device 11 and a cleaning and rinsing device 12 arranged in that order from the side near the carrier receiving/delivering department 2. The drying device 9 dries wafers W by using isopropyl alcohol vapor (IPA vapor). The cleaning and rinsing device 10 cleans wafers W with a cleaning liquid containing a chemical liquid as a principal component and rises the wafers W with pure water. The wafer holder cleaning and drying device 11 cleans and dries wafer holding members 8a and 8b included in a carrying device 8. The cleaning and rinsing device 12 cleans wafers W with a cleaning liquid containing a chemical liquid different from that contained in the cleaning liquid used by the cleaning and rinsing device 10 and rinses the wafers with pure water.

The cleaning and drying department 4 is provided with the carrying device 8 for carrying wafers W to and from the devices 9 to 12. The carrying device 8 has the pair of holding members 8a and 8b capable of being moved toward and away from each other and of moving in the directions of the arrows Y (FIG. 2).

Figure 3:
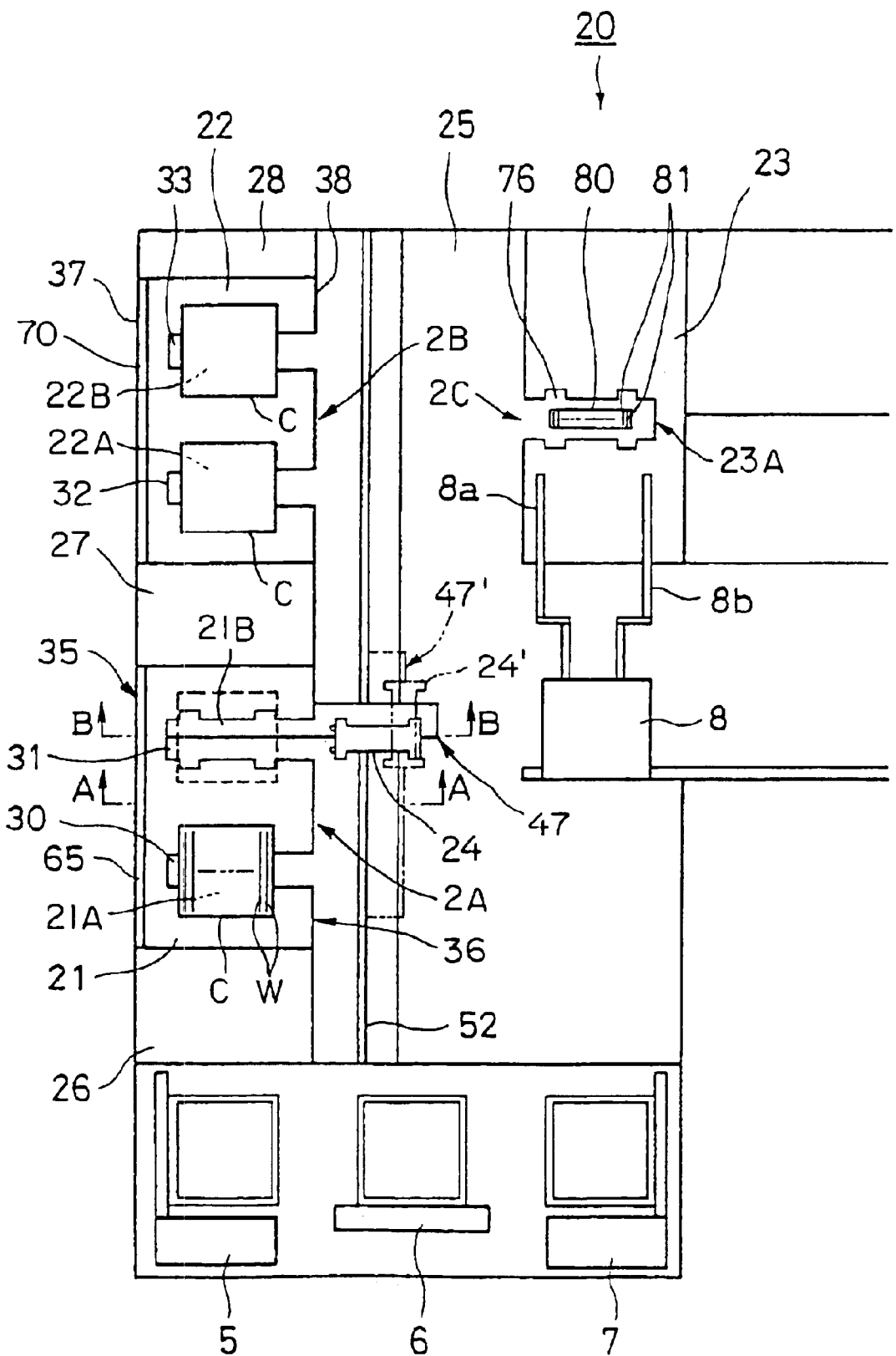
FIG. 3 is an enlarged plan view of an essential portion of the cleaning apparatus shown in FIG. 1.

As shown in FIG. 3, a carrier handling system 20 in a preferred embodiment according to the present invention is installed in the carrier receiving/delivering department 2. The carrier handling system 20 includes a receiving stage 21 installed in the receiving section 2A, a delivery stage 22 installed in the delivery section 2B, a loading/unloading stage 23 installed in the loading/unloading section 2C, the movable table 24 for carrying carriers C from and to the stages 21, 22 and 23. The stages 21, 22 and the stage 23 are spaced by a path 25 in which the movable table 24 moves.

Preferably, the stages 21 and 22 are on the same level. More preferably, stages 21, 22 and 23 are on the same level.

The receiving section 2A is demarcated by side walls 26 and 27 disposed on the opposite sides thereof, and the delivery section 2B is demarcated by the side wall 27 and a side wall 28 disposed on the opposite sides thereof. The receiving stage 21 is secured to the side walls 26 and 27, and the delivery stage 22 is secured to the side walls 27 and 28.

The receiving stage 21 is a plate-shaped member having an upper surface on which carriers C are placed. Two carriers C can be placed on the receiving stage 21. Note that a predetermined position on the stage at which a carrier C is placed will be referred to as the term "station". Cut-away areas 30 and 31 are formed in portions of the receiving stage corresponding to the stations 21A and 21B. Each of the cut-away areas 30 and 31 extends from an end of the receiving stage 21 on the side of the path 25 to a position slightly beyond the corresponding stations 21A and 21B. The delivery stage 22 is the same in construction as the receiving stage 21. Stations 22A and 22B are set on the delivery stage 22. The delivery stage 22 is provided with cut-away areas 32 and 33 of the same shape as that of the cut-away areas 30 and 31 in portions thereof corresponding to the stations 22A and 22B. A single station 23A is set on the loading/unloading stage 23. The loading/unloading stage 23 is provided with a cut-away area 76 of the same shape as that of the cut-away areas 30 and 31 in portion thereof corresponding to the station 23A.

The loading/unloading stage 23 may be formed with an increased area allowing, for example, two carriers C to be placed thereon, and may be provided with stations and cut-away areas corresponding to the number of carriers to be placed thereon.

Figure 7:
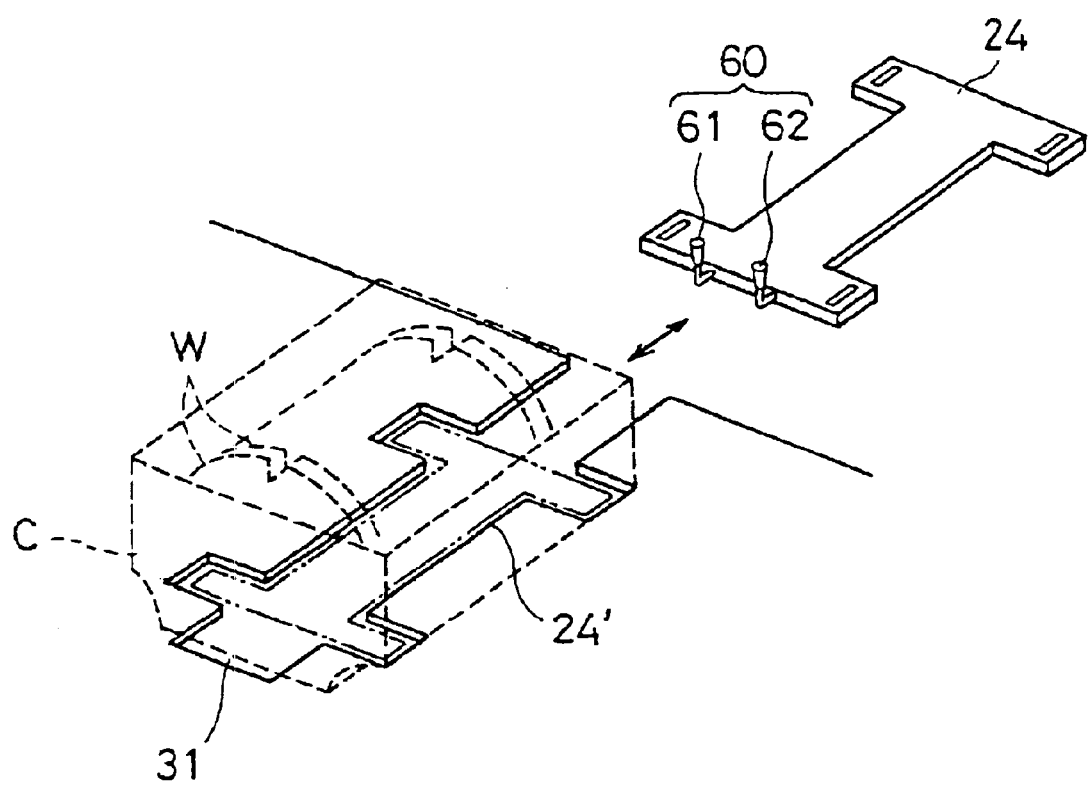
FIG. 7 is a perspective view of a receiving stage and a movable table of assistance in explaining a method of moving a carrier.
Figure 8:
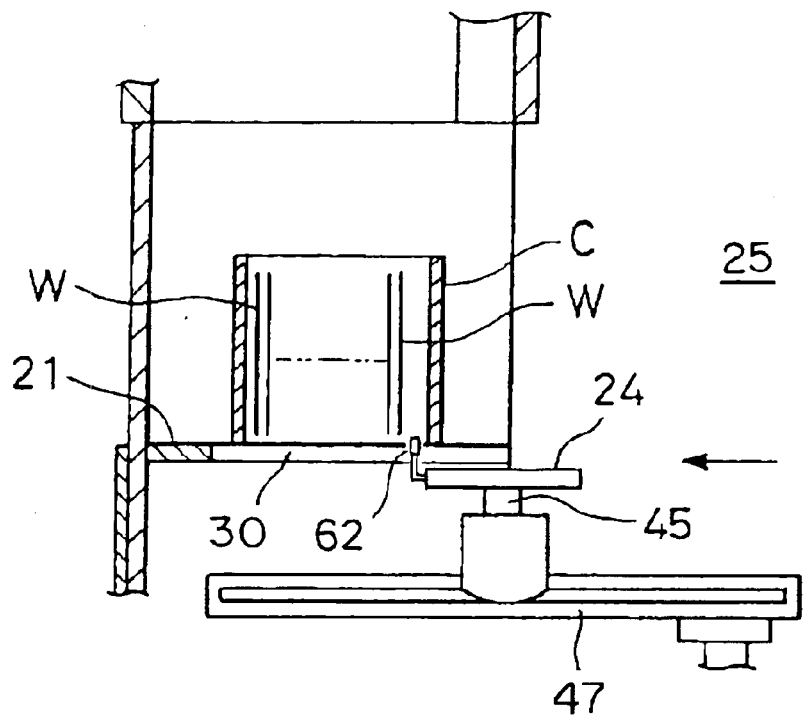
FIGS. 8 to 11 are sectional views taken on line B—B in FIG. 3 of assistance in explaining a series of operations for moving a carrier.
Figure 9:
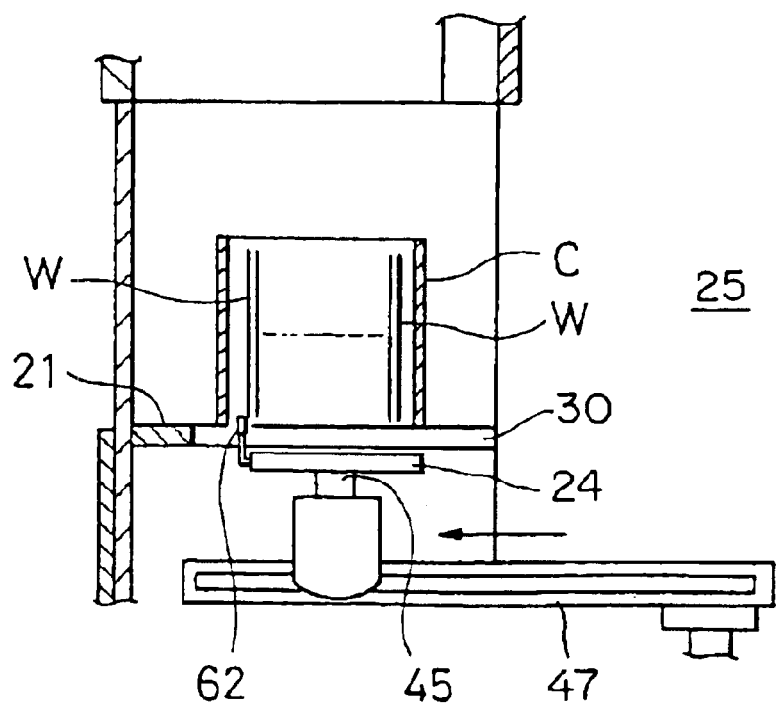

Each of the cut-away areas of the stages is formed in a shape and dimensions that allow the movable table 24 to move vertically through the cut-away area and prevent a carrier C placed at the corresponding station of the stage from falling through the cut-away area from the stage (see FIGS. 3 and 7).

Figure 5:
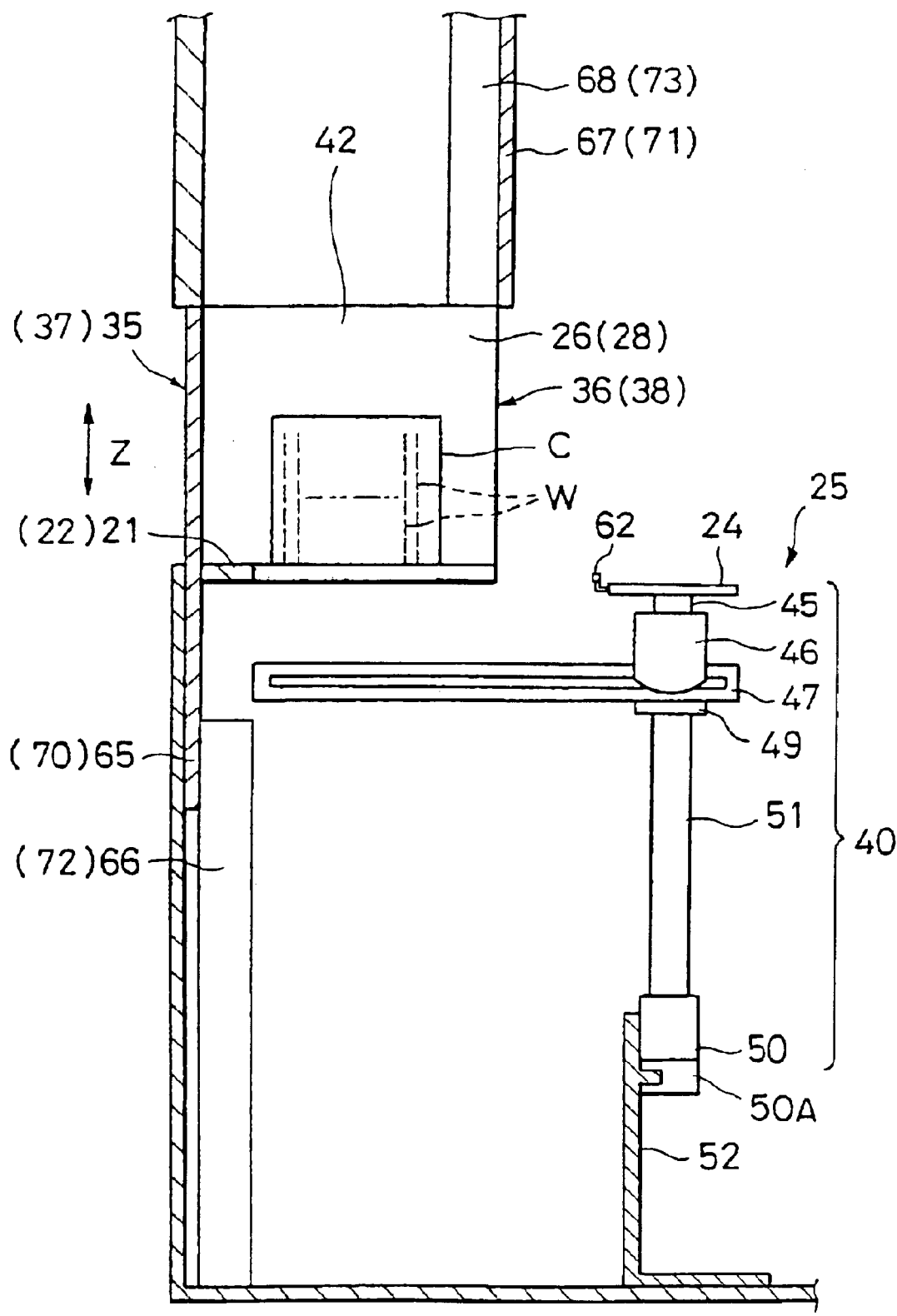
FIG. 5 is a sectional view taken on line A—A in FIG. 3.

FIG. 5 is a sectional view taken on line A—A in FIG. 3. As shown in FIG. 5, a table moving mechanism 40 for moving the movable table 24 is disposed on a level lower than that of any one of the receiving stage 21, the delivery stage 22 and the loading/unloading stage 23.

The table moving mechanism 40 will be described with reference to FIG. 6. A shaft 45 is joined to the lower surface of the movable table 24. The shaft 45 can be moved vertically by a lifting mechanism 46, such as a cylinder actuator, to move the movable table 24 vertically, i.e., in the directions of the arrows Z in FIG. 6.

Figure 6:
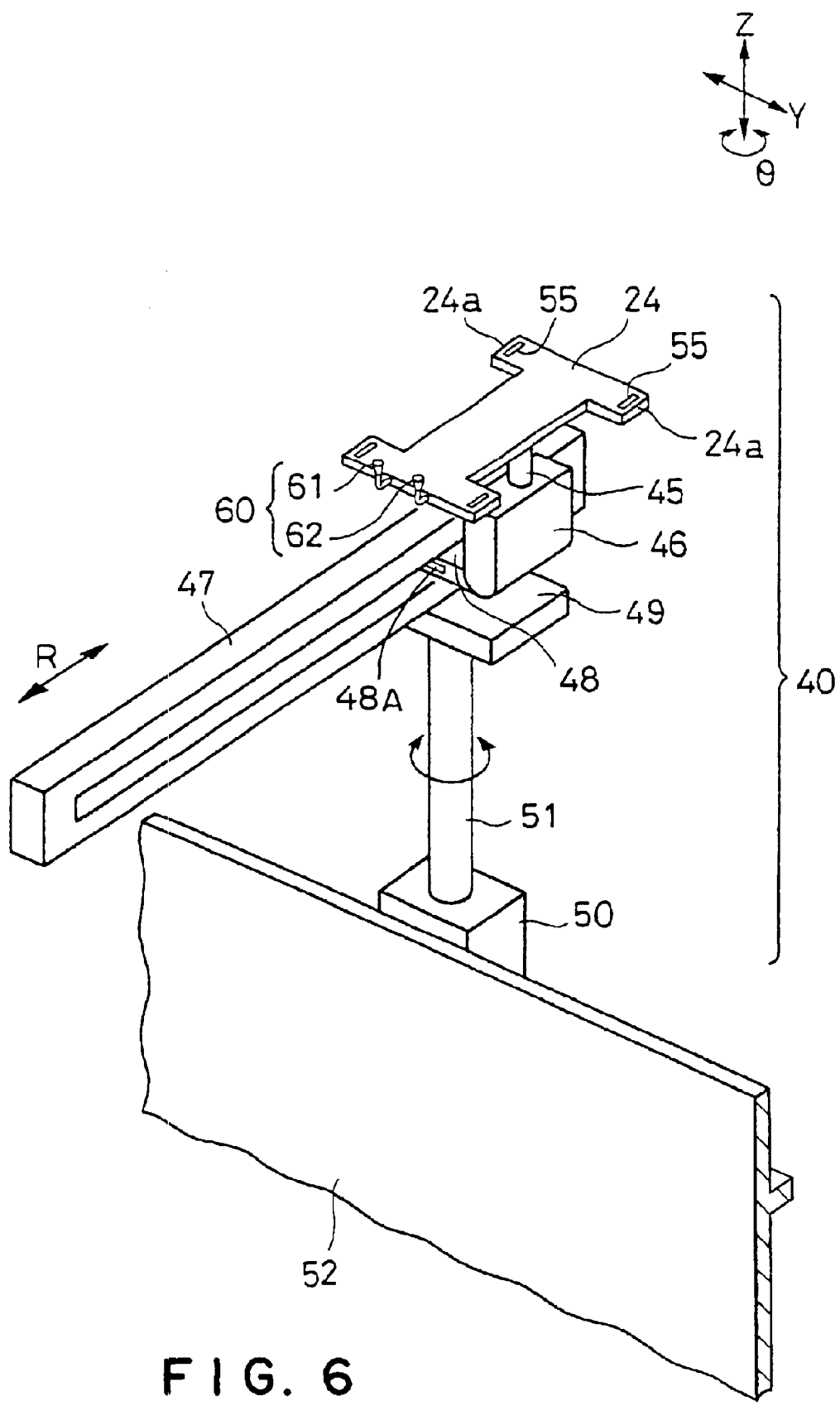
FIG. 6 is a perspective view of a moving mechanism.

The lifting mechanism 46 is attached to a sliding member 48 combined with a horizontal guide rail 47 and is capable of horizontally moving along the length of the guide rail 47 in the directions of the arrows R in FIG. 6. The sliding member 48 is provided with a driving mechanism 48A (illustration of particulars of the driving mechanism 48A is omitted) for moving the sliding member 48 along the guide rail 47. The guide rail 47 has a base end part fixed to the upper surface of a base plate 49. The base plate 49 is supported on a shaft 51. The shaft 51 can be turned by a turning mechanism 50, such as an electric motor. Thus, the guide rail 47 can be turned in a horizontal plane in the directions of the arrows 0 in FIG. 6 by the turning mechanism 50. A base 52 serving also as a guide rail is extended along the length of the path 25. The turning mechanism 50 is supported on the base 52 for horizontal sliding movement in the directions of the arrow Y in FIGS. 2 and 6. The turning mechanism 50 is provided with a driving mechanism 50A for moving the turning mechanism 50 along the base 52.

The movable table 24 employed in this embodiment has a shape substantially resembling the letter H. As shown in FIG. 6, the movable table 24 has projecting parts 24a at its four corners, and the projecting parts 24a are provided with grooves 55 for receiving lugs projecting from peripheral parts of the lower surface of a carrier C, respectively. The movable table 24 is provided with a wafer counter 60, i.e., a sensing device, for counting wafers W contained in a carrier C. The wafer counter 60 includes a light projector 61 that projects a light beam in parallel to the surfaces of wafers W contained in a carrier C, and a light receiver 62 that receives the light beam projected by the light projector 61. The light projector 61 and the light receiver 62 are attached to forward end parts of the movable table 24 so as to project upward from the upper surface of the movable table 24.

Referring again to FIGS. 3 to 5, a front opening 35 through which carriers C are received is formed in the front end of the receiving section 2A. The front opening 35 is covered with a front shutter 65. A back opening 36 is formed on the back side of the receiving stage 21 so as to open into the path 25. The back opening 36 is covered with a back shutter 67. The front shutter 65 and the back shutter 67 can be vertically moved in the directions of the arrows Z in FIG. 5 by shutter lifting mechanisms 66 and 68, respectively.

A front opening 37, through which carriers C are delivered, is formed in the front end of the delivering section 2B. The front opening 37 is covered with a front shutter 70. A back opening 38 is formed on the back side of the delivery stage 22 so as to open into the path 25. The back opening 38 is covered with a back shutter 71. The front shutter 70 and the back shutter 71 can be vertically moved in the directions of the arrows z in FIG. 5 by shutter lifting mechanisms 72 and 73, respectively.

Referring to FIGS. 16 and 17, a wafer holder 80 is disposed below the loading/unloading stage 23. The wafer holder 80 is provided with twenty-six grooves 81 to receive lower peripheral parts of wafers W therein. The wafer holder 80 is supported on a shaft 83 included in a lifting and turning mechanism 82. The lifting and turning mechanism 82 is fixedly supported on the upper surface of a support member 85 capable of vertically moving along a guide rail 84. The wafer holder 80 can be vertically moved by the support member 85 and the lifting and turning mechanism 82 between an upper position indicated by two-dot chain lines in FIG. 17 and a lower position indicated by solid lines in FIG. 17. When raised, the wafer holder 80 passes through the cut-away area 76 of the loading/unloading stage 23.

Each of carriers C to be handled by the handling system 20 is provided with a plurality of slots and is capable of containing, for example, twenty-five wafers W in an upright position in a parallel arrangement. The carrier C has a lower wall provided with an opening. Generally, the wafer W is circular and is provided with a notch Wa in its circumference. An alignment device, not shown, disposed in the carrier receiving/delivering department 2 uses notches Wa formed in the circumferences of wafers W to align the wafers W in the carrier C.

A series of processes to be carried out by the cleaning apparatus 1 will be described hereinafter.

The front shutter 65 of the receiving section 2A is opened and the back shutter 67 of the same is closed. When operating the back shutter 67, the movable table 24 and the guide rail 47 are held at positions indicated by two-dot chain lines 24' and 47' in FIG. 3 to avoid obstructing the movement of the back shutter 67.

Figure 4:
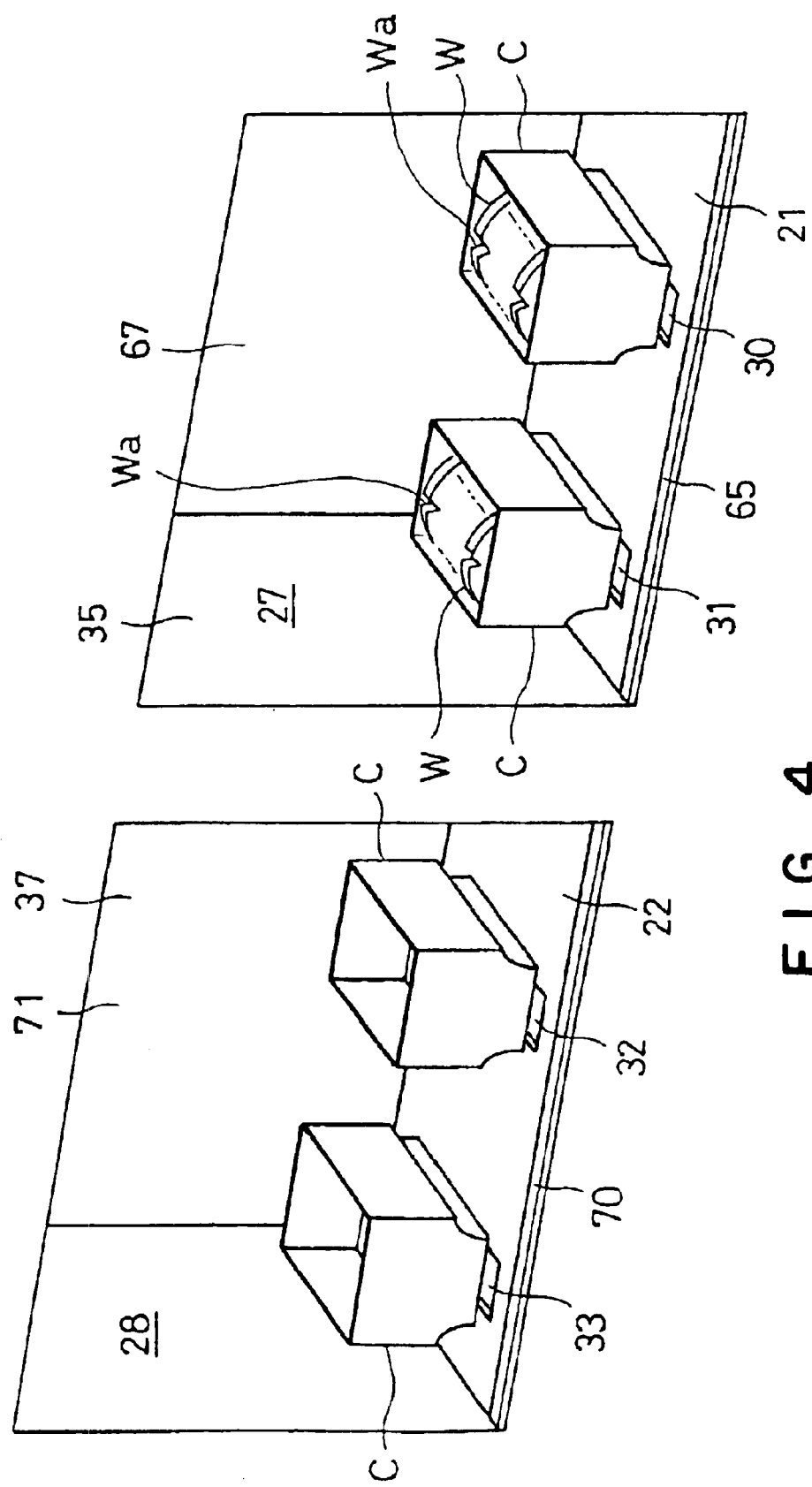
FIG. 4 is a perspective view of a receiving stage and a delivery stage.

As shown in FIG. 4, an operator or an AGV carries two carriers C each containing, for example, twenty-five wafers w to be cleaned to the receiving section 2A of the cleaning apparatus 1. After the carriers C have been placed at the stations 21A and 21B of the receiving stage 21 as shown in FIG. 5, the front shutter 65 is closed and the back shutter 67 is opened.

Subsequently, the movable table 24 and the guide rail 47 are turned from positions indicated by two-dot chain lines in FIG. 3 to positions indicated by solid lines 24 and 47 in FIG. 3 to extend the guide rail 47 on a level below the station 21A of the receiving stage 21. Then, the movable table 24 is advanced to a position indicated by two-dot chain lines 24' in FIG. 7. While the movable table 24 is thus advanced, the wafer counter 60 counts the wafers W and inspects the carrier C for jump slots.

Figure 11:
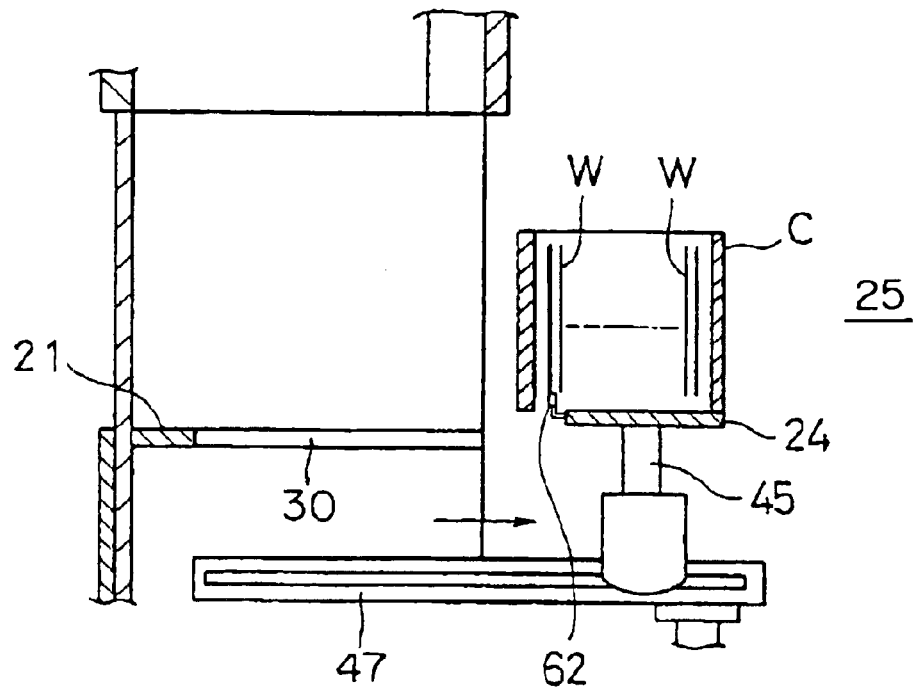
Figure 12:
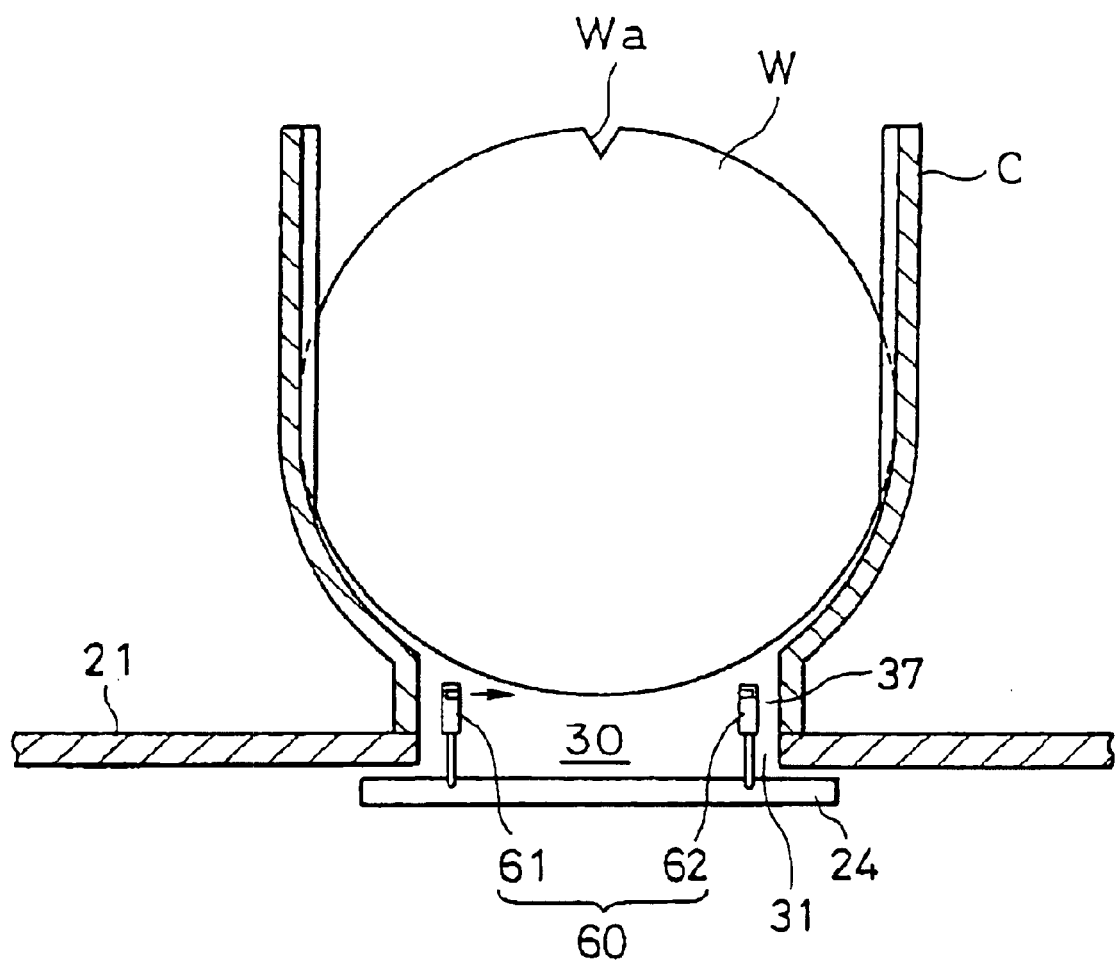
FIG. 12 is a schematic sectional view of a carrier of assistance in explaining an inspecting operation of a wafer counter inserted in the carrier.

Such operations of the movable table 24 and the wafer counter 60 will be described with reference to FIGS. 8 to 11. The movable table 24 is advanced from a level slightly lower than that of the movable table 24 shown in FIG. 8 to a position shown in FIG. 8. Subsequently, the movable table 24 is raised slightly to insert the light projector 61 and the light receiver 62 into the carrier C as shown in FIG. 12. Then, the movable table 24 is advanced on the level shown in FIG. 8 to and stopped at a position shown in FIG. 9. While the movable table 24 is advanced from the position shown in FIG. 8 to the position shown in FIG. 9, the light projector 61 and the light receiver 62 scan the interior of the carrier C.

Figure 13A:
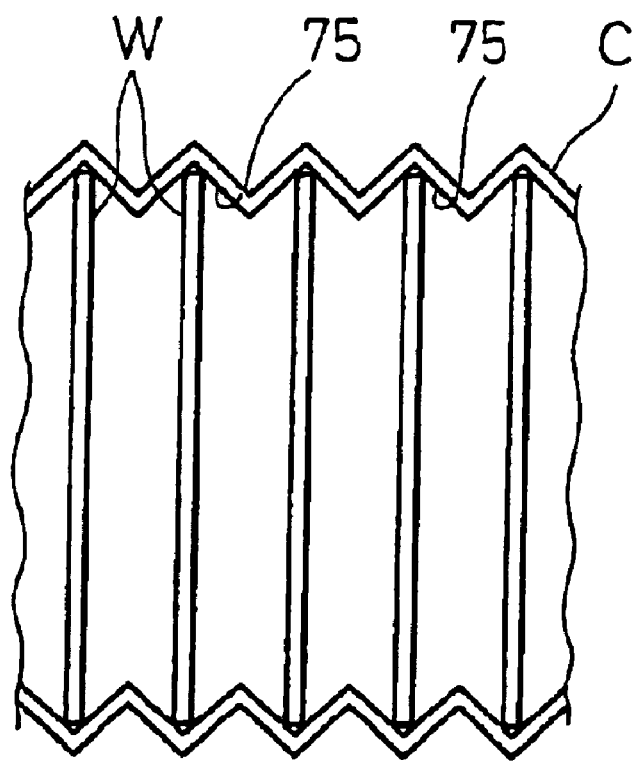
FIG. 13A is a view of a carrier normally containing a predetermined number of wafers.
Figure 13B:
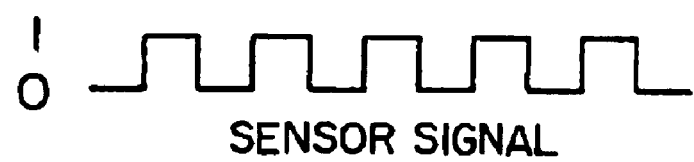
FIG. 13B is waveform of a signal provided by a wafer counter when a carrier is loaded normally with wafers as shown in FIG. 13A.

A light beam projected by the light projector 61 is intercepted by the wafers W. The light receiver 62 provides a pulse every time the light beam is intercepted. Therefore when the wafers W are received normally in slots 75 as shown in FIG. 13A, the light receiver 62 generates a regular pulse signal as shown in FIG. 13B. The number of the wafers W is known by counting the pulses of the pulse signal.

When there is a vacant slot 75 in the carrier C as shown in FIG. 14A, the light receiver 62 does not generate any pulse at a position corresponding to the vacant slot 75 as shown in FIG. 14B.

When there is a jump slot in the carrier C as shown in FIG. 15A, the light receiver 62 generates an abnormal pulse having a pulse width greater than that of normal pulses at a position corresponding to the jump slot as shown in FIG. 15B. Thus, it is known that the carrier C has a jump slot or jump slots from the abnormal pulse signal as shown in FIG. 15B.

After it has been confirmed that a predetermined number of wafers W are contained correctly in the carrier C, the movable table 24 carries the carrier C to the loading/unloading stage 23. If any abnormality, such as a shortage of wafers, is found in the carrier C, the carrier C is taken out of the receiving stage 21 and another carrier C expected to contain wafers W normally is supplied to the receiving stage 21. Since the number and condition of the wafers W in the carrier C are inspected during a preparatory operation before lifting up the carrier C, the throughput of the cleaning process can be enhanced. Since the number and condition of the wafers W in the carrier C are inspected upon the placement of the carrier C on the receiving stage 21, problems can be found measures can be taken at an early stage of the cleaning process.

Figure 10:
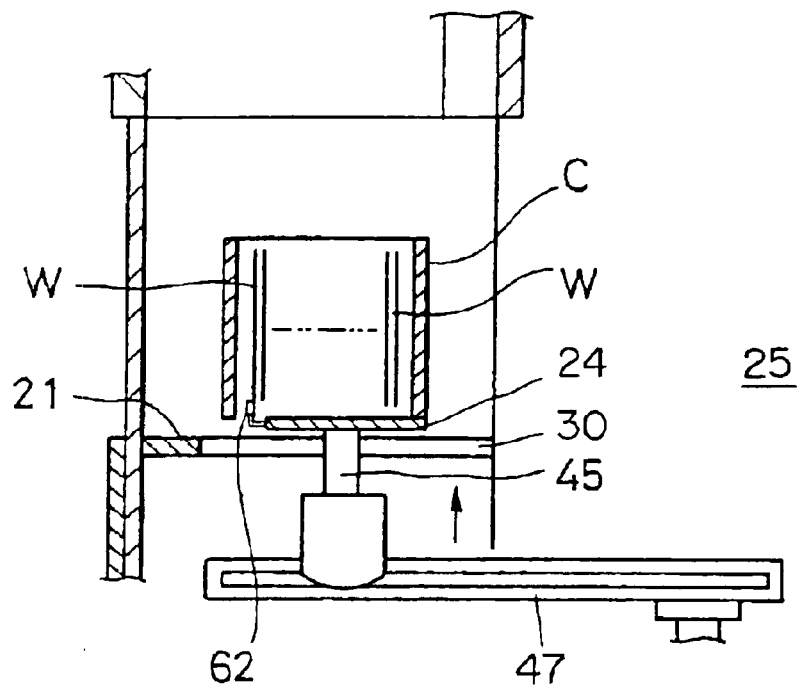

To carry the carrier C from the receiving stage 21 to the loading/unloading stage 23, the movable table 24 is raised to lift up the carrier C from the receiving stage 21 as shown in FIG. 10. Then, the movable table 24 is retracted toward the path 25 to shift the carrier C away from a position above the receiving stage 21 as shown in FIG. 11. When the movable table 24 is thus retracted, the shaft 45 moves through the cut-away area 30. Then, as shown in FIG. 16, the turning mechanism 50 turns the movable table 24 and the guide rail 47 counterclockwise through an angle of 90° in a horizontal plane.

Then, the driving mechanism 50A drives the turning mechanism 50 for movement along the base 52 without changing the direction of the guide rail 47 to move the movable table 24 horizontally so as to carry the carrier C to a position indicated by two-dot chain lines in FIG. 16. Subsequently, the turning mechanism 50 turns the guide rail 47 counterclockwise, as viewed in FIG. 16, through an angle of 90° in a horizontal plane to locate the guide rail 47 under the loading/unloading stage 23. Then, the movable table 24 is moved horizontally along the guide rail 47 to locate the carrier C above the loading/unloading stage 23. Then, the lifting mechanism 46 lowers the movable table 24 to a level below the loading/unloading stage 23 to transfer the carrier C from the movable table 24 to the loading/unloading stage 23. Then, the movable table 24 is retracted from a position below the loading/unloading stage 23 along the guide rail 47.

Upon the placement of the carrier C containing the wafers C on the loading/unloading stage 23, the wafer holder 80 is railed as shown in FIG. 17. Consequently, the wafer holder 80 enters the carrier C through the opening formed in the bottom wall of the carrier C, receives the wafers W held in the slots of the carrier C in its grooves 81 and takes out the wafers W from the carrier C. The wafer holder 80 is raised to a position indicated by two-dot chain lines in FIG. 17. Then, the wafer holder 80 is turned through an angle of 90° abut a Z-axis. Then, the holding members 8a and 8b of the carrying device 8 take up the wafers W from the wafer support hand 80 and carries the same to the processing department 4.

The wafers W are carried to the cleaning and rinsing devices 10 and 12 successively for cleaning, and are carried to the drying device 9 for cleaning. The wafers W thus cleaned and dried are returned to the loading/unloading stage 23. The foregoing operations for taking out the wafers W from the carrier C are reversed to return the wafers W thus processed by the processing department 4 into the carrier C kept on the loading/unloading stage 23.

Then, the carrier C placed on the loading/unloading stage 23 is supported on the movable table 24 by operations similar to those previously described with reference to FIGS. 8 to 11. The wafer counter 60 inspects the number and condition of the wafers W contained in the carrier C while the movable table 24 is being moved to a position directly below the station 23A to confirm that any wafers W are not left in the processing department 4.

Then, movable table 24 transfers the carrier C from the loading/unloading stage 23 to the delivery stage 22. The carrier C is placed on the delivery stage 22 at the station 22A. During this operation, the back shutter 71 of the delivery section 2B is open and the front shutter 70 of the same is closed.

Subsequently, the other carrier C set on the receiving stage 21 at the station 21B is carried to the loading/unloading stage 23, wafers W are taken out of the carrier C and are subjected to the cleaning and drying processes. Then, the foregoing operations are repeated to carry the carrier C containing the processed wafers W from the loading/unloading stage 23 to the delivery stage 22. This carrier C is placed on the delivery stage 22 at the station 22B.

Subsequently, the movable table 24 and the guide rail 47 are moved away from under the delivery stage 22, the back shutter 71 of the delivery section 2B is closed and the front shutter 70 is opened. Then, the operator takes out the two carriers C from the delivery section 2B through the front opening 37.

As mentioned above, two carriers C are carried to the receiving stage 21, the two carriers C are carried one at a time from the receiving stage 21 to the loading/unloading stage 23. Every time one carrier C is placed on the loading/unloading stage 23, wafers W are taken out of the carrier C and are subjected to a predetermined cleaning process. Then, the processed wafers W are put in the carrier C on the loading/unloading stage 23 and the carrier C is carried horizontally from the loading/unloading stage 23 to the delivery stage 22. After the two carriers C have been placed on the delivery stage 22, the two carriers C are delivered from the delivery section 2B. When delivering the carriers C from the delivery section 2B, the front shutter 70 is opened and the back shutter 71 is closed. The interlocked operations of the shutters 35 and 37 and those of the shutters 70 and 71, and the operations of the moving mechanism 40 are controlled by a controller, not shown.

The carrier handling system 20 according to the present invention has the following advantageous effects.

Since the carrier c is placed on and carried by the movable table 24, a space 42 extending over the receiving stage 21, the delivery stage 22 and the loading/unloading stage 23 is always vacant.

Since the table moving mechanism 40 is disposed on a level lower than that of any one of the receiving stage 21, the delivery stage 22 and the loading/unloading stage 23, any components of the driving mechanism of the table moving mechanism 40 do not enter the space 42 extending over the stages 21, 22 and 23 when carrying the carrier C. As known from the foregoing description, only components that have a chance to enter the space 42 extending over the stages 21, 22 and 23 are only the movable table 24, the shaft 45 and the wafer counter 60. Accordingly, injuries to the operator due to the accidental contact of the operator with the movable table 24 or the moving mechanism 40 can be prevented and safety can be secured. Since the space 42 extending over the stages 21, 22 and 23 is always vacant, the carrier handling system 20 is simplified. Part of the vacant space 42 may be effectively used, for example, as a storage space for storing carriers C provided that operations for moving the carrier C are not obstructed.

Since it is a rule to close either the front or the back shutter of the receiving section 2A and either the front or the back shutter of the delivery section 2B, injuries to the operator due to accidental contact between the operator and the moving component of the carrier handling system 20 can be avoided with reliability.

Since the wafer counter 60 is inserted into the carrier C through the opening formed in the bottom wall of the wafer W to inspect the wafers W contained in the carrier C, the wafer counter 60 is rarely exposed during inspection and hence accidental contact between the wafer counter 60 and the operator can be avoided. Since the wafer counter 60 is incorporated into the movable table 24, the carrier handling system 20 is simplified.

Figure 18:
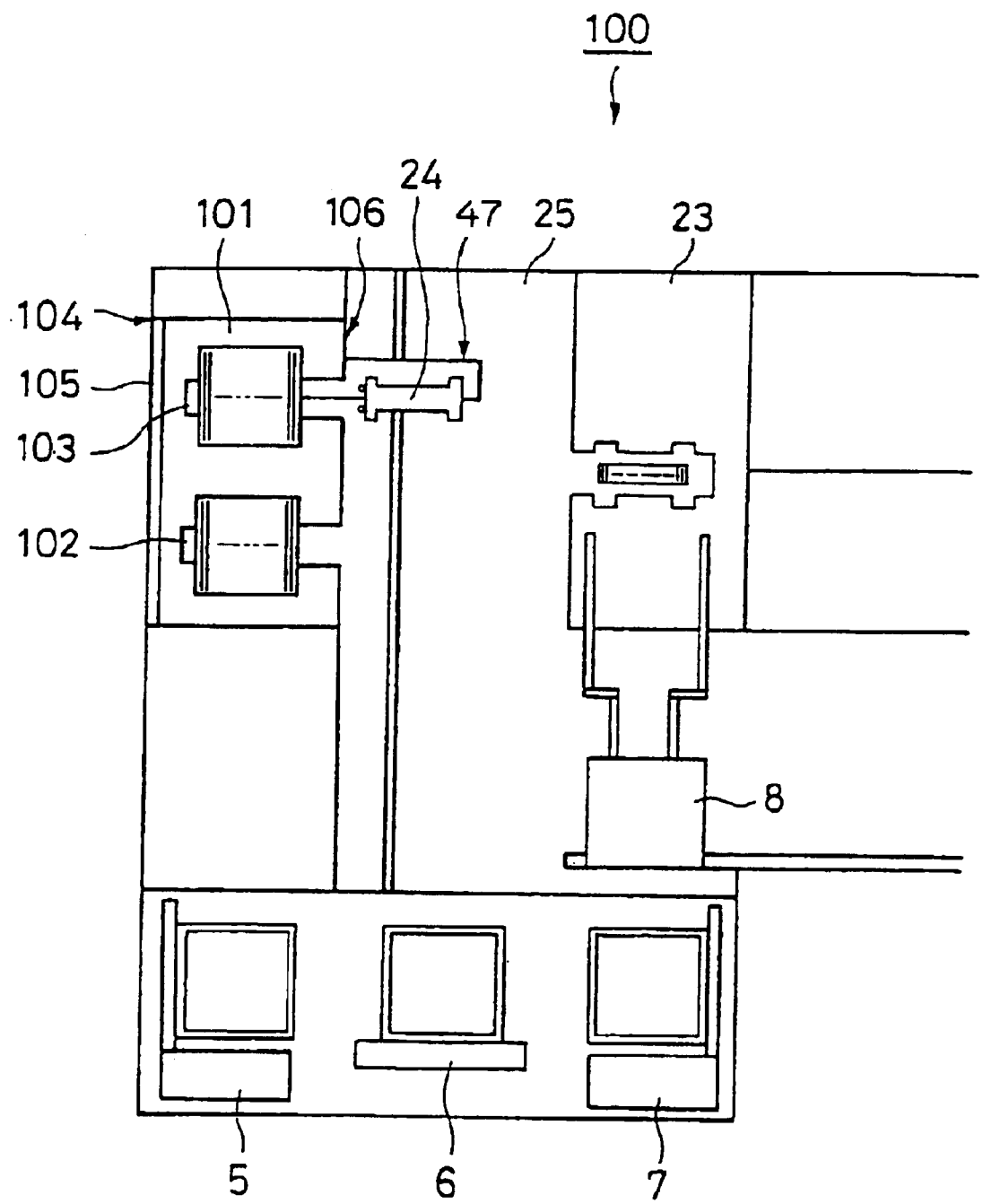
FIG. 18 is a schematic plan view of a modification of a receiving/delivering unit shown in FIG. 3.

A cleaning apparatus 100 shown in FIG. 18 in a modification of the cleaning apparatus 1 shown in FIG. 1 may be provided with a single receiving/delivering section 2D as shown in FIG. 18 instead of the receiving section 2A and the delivery section 2B shown in FIG. 3. The cleaning apparatus 100 shown in FIG. 18 is provided with a single receiving/delivering stage 101 having stations 102 and 103, and provided with openings at positions corresponding to the stations 102 and 103. The receiving/delivering section 2D has a front opening 104 and a back opening 106. The front opening 104 can be covered with a front shutter 105 that is raided to a closing position. The back opening 106 can be covered with a back shutter, not shown, that is lowered to a closing position. The cleaning apparatus 100 is the same in other respects as the cleaning apparatus 1 shown in FIG. 3.

The operation of the cleaning apparatus 100 shown in FIG. 18 will be described hereinafter. Two carriers C are carried to the receiving/delivering section 2D and are set at the stations 102 and 103 on the receiving/delivering stage 101. The carrier C at the station 102 is moved by the movable table 24 to the loading/unloading stage 23, wafers W are taken out of the carrier C and the wafers W are carried to the processing department 4. The empty carrier C is kept on the loading/unloading stage 23. After being processed, the wafers W are returned to the carrier c kept on the loading/unloading stage 23. Then, the movable table 24 returns the carrier C to the station 102. Subsequently, the other carrier C placed at the station 103 is carried to the processing department 4, wafers W contained in the carrier C are processed and returned to the carrier C, and then the same carrier C is returned to the station 103.

In the cleaning apparatus 1 shown in FIG. 3, the loading/unloading stage 23 may be divided into a loading stage and an unloading stage. When the cleaning apparatus is provided with the loading stage and the unloading stage, a carrier is carried from the receiving stage 21 to the unloading stage, the is transferred from the unloading stage to the loading stage and is carried from the loading stage to the delivery stage 22.

Figure 19:
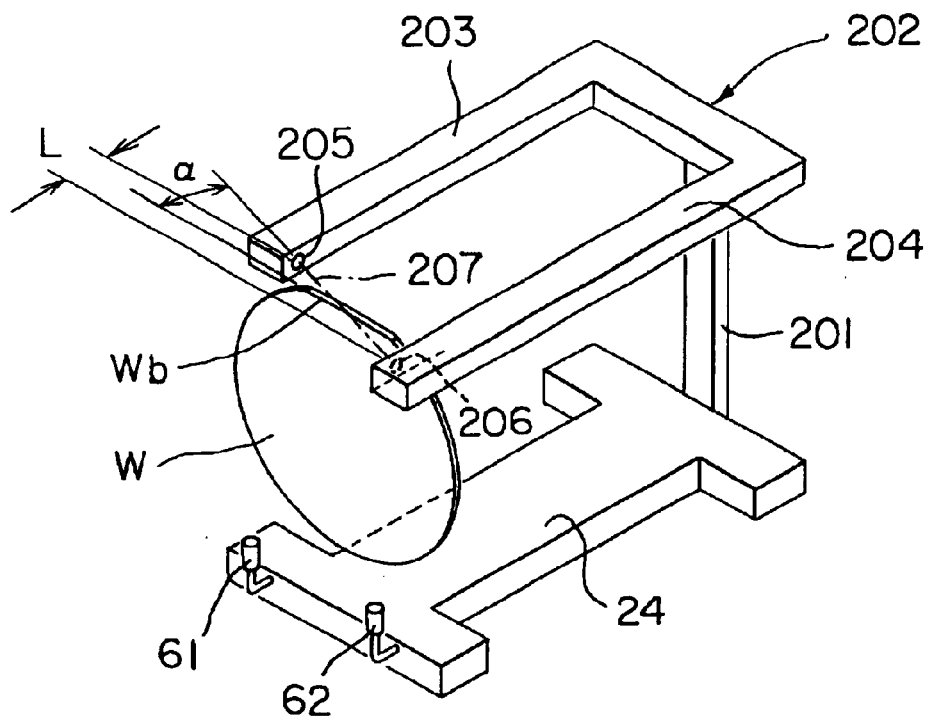
FIG. 19 is a schematic perspective view showing another embodiment of the movable table.
Figure 20:
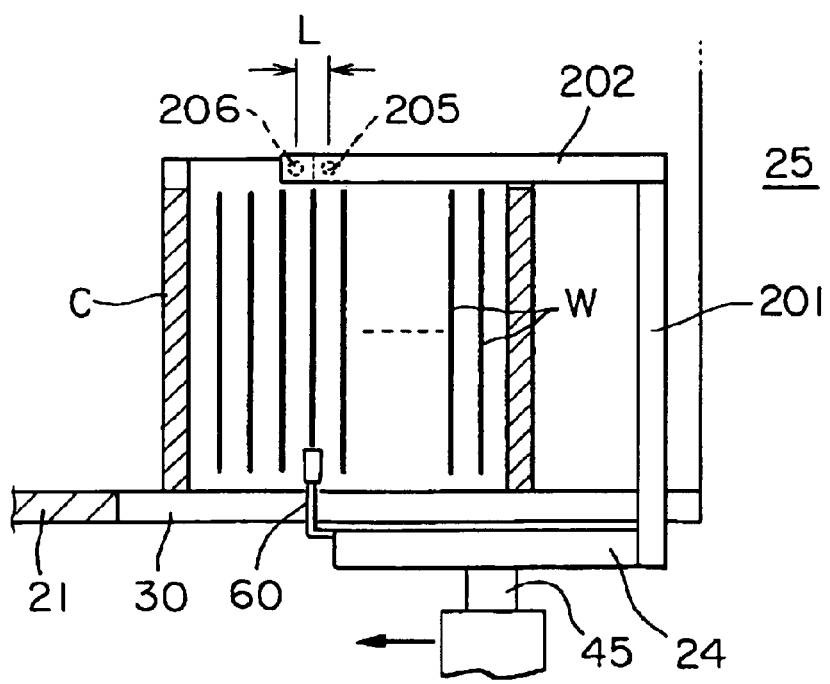
FIG. 20 is a sectional view taken on line B—B in FIG. 3 of assistance in explaining an inspecting operation of an orientation flat sensor attached to the movable table of FIG. 19.

Another embodiment of the moving table is hereby described referring to FIGS. 19–21. As shown in FIG. 19, a support 201 is provided at a rear end of the movable table 24 and a bracket 202 having a square bracket shape is fixed to an upper end of the support 201. The bracket 202 has a pair of forward extending portions 203, 204 whose lengths are different from each other. The extending portion 204 is longer than the extending portion 203. A light projector 205 and a light receiver 206 are provided at the front ends of the extending portions 203, 204 respectively and the light projector 205 and light receiver 206 form an orientation flat sensor.

The light projector 205 is capable of irradiating sensor light 20 toward the light receiver 206. The light projector 205 and the light receiver 206 are offset to each other by a length L in the direction from the front end to the rear end of the bracket 202.

As shown in FIG. 20, when the movable table 24 is horizontally moved below the stage 21, the scanning by the orientation flat sensor takes place simultaneously with that of the wafer counter 60. In FIGS. 20 and 21, when the light projector 61 and the light receiver 62 of the wafer counter 60 are positioned at both sides of the lower end of the wafer W contained in the carrier C, the light projector 205 and the light receiver 206 of the orientation flat sensor are positioned at both sides of the upper end of the wafer W.

In FIG. 21, the wafer W is placed in a proper manner where an orientation flat $W_b$ of the wafer w is positioned at the top of the wafer W. In this case, the sensor light 207 irradiated from the light projector 205 reaches the light receiver 206 without being cut off by the wafer W.

On the other hand, when the wafer W is placed in the carrier C in a manner where the wafer is rotated beyond a permitted angle (normally angles of ±5 degrees) indicated by a two-dot chain line in FIG. 21, the sensor light 207 irradiated from the light projector 205 does not reach the light receiver 206 because the sensor light 207 is cut off by the wafer W.

FIG. 19 shows one of the plurality of wafers W contained in the carrier C (not shown in FIG. 19) placed on the stage 21 (not shown in FIG. 19). Since the light projector 205 and the light receiver 206 are offset to each other, the sensor light 207 crosses with an inclination of angle α (normally about 5 degrees) on which the wafer W in the carrier C is positioned. Thus, a detection error, which could occur in the case where angle α is zero, can be prevented.

This container handling system is applicable not only to a cleaning apparatus of a batch processing system but also to other apparatus that carries out a predetermined process, such as a wafer cleaning apparatus that cleans wafers one at a time or a coating apparatus that applies a predetermined liquid to wafers. The substrates are not limited to semiconductor wafers and may be substrates other than semiconductor substrates, such as LCD substrates.

What is claimed is:

1. A substrate processing apparatus comprising:
    a first stage provided in a first section of said apparatus for supporting thereon a container for holding substrates, the first stage having a cut-away area and a clearance area extending from the cut-away area to one end of the first stage;
    a second stage provided in a second section of said apparatus for supporting thereon a container for holding substrates, the second stage having a cut-away area and a clearance area extending from the cut-away area to one end of the second stage;
    a movable table for supporting and carrying the container between the first and second stages;
    a table moving mechanism adapted to move the movable table, including
        a first horizontal moving mechanism adapted to move the movable table horizontally, the horizontal moving mechanism having a guide rail that guides the movable table to move horizontally, and a driving mechanism that moves the movable table along the guide rail,
        a turning mechanism adapted to turn the guide rail in a horizontal plane so that the guide rail is capable of being located at a first position below the first stage with the guide rail being aligned with the cut-away area thereof and is capable of being located at a second position below the second stage with the guide rail being aligned with the cut-away area thereof, and
        a lifting mechanism adapted to move the movable table vertically; and
    a sensing device coupled to the movable table for sensing a condition of the substrates in the container as the movable table is moved in a direction perpendicular to the substrates into the first position below the first stage;
    whereby the movable table (a) moves horizontally below the cut-away area of one of the stages while being guided by the guide rail located below said one of the stages, (b) moves vertically through the cut-away areas of said one of the stages and lifts up the container in order to transfer the container from one of the stages to the movable table by the lifting mechanism, and (c) withdraws the container thus lifted from above said one of the stages while being guided by the guide rail located below said one of the stages in order to transport the container to another stage,
    wherein the cut-away areas are shaped and sized so that the sensing device has uninterrupted access to the substrates as the movable table moves in a direction perpendicular to the substrates into the first position below the first stage, and so that the container is incapable of passing through the cut-away areas vertically and the moving table is capable of passing through the cut-away areas vertically.

2. The apparatus according to claim 1, wherein the first section is a section where the substrates are taken out from the container and are put into the container,
    said apparatus further comprising a processing unit that performs a treatment on the substrate taken out from the container at the first section.

3. The substrate processing apparatus according to claim 1, wherein the lifting mechanism is slidably mounted to the guide rail to move along the guide rail, and the movable table is mounted to the lifting mechanism.

4. The substrate processing apparatus according to claim 3, wherein the lifting mechanism includes a shaft connected to a bottom of the movable table, the shaft being adapted to move vertically by the lifting mechanism to move the movable table vertically, and the shaft being sized so that the shaft is capable of horizontally passing through the cut-away area of each of the stages.

5. The substrate processing apparatus according to claim 1 further comprising a second horizontal moving mechanism adapted to move the movable table together with the table moving mechanism to a position adjacent to each of the stages.

6. The substrate processing apparatus according to claim 2, wherein the second section is a section having the second stage where the container is received from outside the apparatus and/or is made available for delivery to a source outside the apparatus.

7. The substrate processing apparatus according to claim 2, wherein said apparatus is an integrated unit, and wherein the second section is a section where the container is received from outside of the apparatus and/or is delivered to the outside of the apparatus therefrom, said apparatus further comprising:
    a first shutter isolating the second section from the outside of the apparatus to inhibit access to the second section from the outside of the apparatus; and
    a second shutter disposed on a side opposite, with respect to the second section, to a side on which the first shutter is disposed.

8. A substrate processing apparatus according to claim 7, further comprising a controller controlling operations of the first and the second shutters so that the second shutter is closed when the first shutter is opened, and the first shutter is closed when the second shutter is opened.

9. The substrate processing apparatus according to claim 1,
    wherein the sensing device includes a first sensor unit,
    wherein the first sensor unit is positioned higher than a mounting surface of the movable table so that the first sensor unit can go to a lower portion of the container through the cut-away area of the stage when the container is placed on the stage and the movable table is positioned lower than a mounting surface of the stage, and
    wherein the first sensor unit inspects the condition of the substrates contained in the container, when the movable table is horizontally moved below the stage while the container is kept on the stage.

10. The substrate processing apparatus according to claim 1, wherein the sensing device inspects, as the condition of the substrates contained in the container, the number of the substrates contained in the container and whether or not there is any jump slot in the carrier.

11. The substrate processing apparatus according to claim 1, wherein the sensing device includes a second sensor unit, wherein the second sensor unit is positioned higher than a mounting surface of the movable table so that the second sensor unit can be positioned in the vicinity of upper portions of the substrates contained in the container when the container is placed on the stage and the movable table is positioned lower than a mounting surface of the stage, and wherein the second sensor unit inspects whether or not a positioning portion of each substrate is placed in a correct position, when the movable table is horizontally moved below the stage while the container is kept on the stage.

12. The substrate processing apparatus according to claim 2, wherein said apparatus is an integrated unit, and wherein the second section is a section where the container is received from an outside of the apparatus, said apparatus further comprising a third stage, on which a container for containing substrates therein is to be placed, provided in a third section of said apparatus, wherein the third section is a section where the container is delivered to the outside of the apparatus therefrom, wherein the third stages has a cut-away area extending from one end of the stage, the cut-away area permits the movable table moving vertically through the cut-away area in order to lift the container from the third stage and withdraw the movable table thus lifted from above the third stage, and wherein the moving table transports the container between the first, second and third stages.

13. The substrate processing apparatus according to claim 1, comprising a passage means through which the moving table moves and transports the container between the first and second stages.

14. A substrate processing apparatus comprising:

a first stage in a first section of said apparatus for supporting thereon a container for holding substrates, the first stage having a cut-away area and a clearance area extending from the cut-away area to one end of the first stage;

a second stage in a second section of said apparatus for supporting thereon a container for holding substrates, the second stage having a cut-away area and a clearance area extending from the cut-away area to one end of the second stage;

a movable table for supporting and carrying the container between the first and second stages, wherein the movable table (a) moves horizontally below the cut-away area of one of the stages, (b) moves vertically through the cut-away areas of said one of the stages and lifts up the container in order to transfer the container from one of the stages to the movable table, and (c) withdraws the container thus lifted from above said one of the stages in order to transport the container to another stage; and a sensing device mounted to the movable table in such a manner that the sensing device moves horizontally together with the movable table when the movable table is moving horizontally below the cut-away area of said one of the stages, so that the sensing device scans the substrates contained in the container supported by the stage in order to inspect a containing-condition of the substrates as the movable table is moved in a direction perpendicular to the substrates;

wherein the cut-away areas are shaped and sized so that the sensing device has uninterrupted access to the substrates as the movable table moves perpendicular to the substrates below the first stage, and so that the container is incapable of passing through the cut-away areas vertically and the moving table is capable of passing through the cut-away areas vertically.

15. The substrate processing apparatus according to claim 14, wherein the sensing device includes a first sensor unit, which is mounted to the movable table in such a manner that the first sensor unit is capable of accessing lower portions of the substrate through the cut-away area and an opening formed at a bottom of the container, when the movable table is moving horizontally below the cut-away area of said one of the stages.

16. The substrate processing apparatus according to claim 14, wherein the sensing device includes a second sensor unit, which is mounted to the movable table in such a manner that the first sensor unit is capable of accessing upper portions of the substrate through an upper opening formed at a top of the container, when the movable table is moving horizontally below the cut-away area of said one of the stages.

* * * * *